(12) United States Patent
Huang

(10) Patent No.: US 12,726,193 B2
(45) Date of Patent: Sep. 1, 2026

(54) BOOTSTRAPPED SWITCH CIRCUIT

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 9 days.

(21) Appl. No.: 19/032,473

(22) Filed: Jan. 21, 2025

(65) Prior Publication Data

US 2025/0247088 A1 Jul. 31, 2025

(30) Foreign Application Priority Data

Jan. 31, 2024 (TW) ................................ 113103843

(51) Int. Cl.
*H03K 17/06* (2006.01)
*H03K 19/017* (2006.01)

(52) U.S. Cl.
CPC ..... *H03K 17/063* (2013.01); *H03K 19/01735* (2013.01)

(58) Field of Classification Search
CPC ............... H03K 17/063; H03K 17/041; H03K 17/04106; H03K 17/06; H03K 19/01; H03K 19/017; H03K 19/01707; H03K 19/01714; H03K 19/01721; H03K 19/01728; H03K 19/01735; H03K 19/01742; H03K 19/018521
See application file for complete search history.

(56) References Cited

U.S. PATENT DOCUMENTS

2021/0105014 A1* 4/2021 Huang ............... H03K 19/0963
2023/0091800 A1 3/2023 Huang

FOREIGN PATENT DOCUMENTS

TW I774563 8/2022

* cited by examiner

*Primary Examiner* — Jung Kim
(74) *Attorney, Agent, or Firm* — WPAT, PC

(57) ABSTRACT

A switch circuit has an input terminal and an output terminal and includes a first capacitor, a second capacitor, five switches, and a switch group. Two terminals of the first capacitor are a first node and a second node. Two terminals of the second capacitor are a third node and a fourth node. The switch group is coupled to the first node, the second node, the third node, and the fourth node. The switch circuit is turned on or off according to a clock. When the clock is at a first level, the switch group couples the third node and the fourth node to the second node and the first node respectively. When the clock is at a second level, the switch group couples the third node and the fourth node to a first voltage and a second voltage respectively. The first level is different from the second level.

18 Claims, 9 Drawing Sheets

BOOTSTRAPPED SWITCH CIRCUIT

BACKGROUND OF THE INVENTION

1. Field of the Invention

The present invention generally relates to a switch circuit, and, more particularly, to a switch circuit having a bootstrap capacitor.

2. Description of Related Art

FIG. 1 is a circuit diagram of a conventional bootstrapped switch. The bootstrapped switch 100 includes a switch 101, a switch 102, a switch 103, a switch 104, a switch 105, and an N-channel metal-oxide-semiconductor field-effect transistor (N-channel MOSFET, hereinafter referred to as NMOS transistor) 106, and a bootstrap capacitor 107. The input terminal VI and the output terminal VO of the bootstrapped switch 100 are respectively coupled to the source and drain of the NMOS transistor 106. The gate of the NMOS transistor 106 is coupled to the voltage source V3 through the switch 105 as well as coupled to one terminal of the bootstrap capacitor 107 and one terminal of the switch 101 through the switch 104. The other terminal of the switch 101 is coupled to the voltage source V1. The other terminal of the bootstrap capacitor 107 is coupled to the voltage source V2 through the switch 102 and coupled to the source of the NMOS transistor 106 and the input terminal VI of the bootstrapped switch 100 through the switch 103. The voltage source V1 is the power supply voltage VDD, while the voltage source V2 and the voltage source V3 are the ground level. The operation of the bootstrapped switch 100 is known to people having ordinary skill in the art and thus omitted for brevity.

The disadvantage of the bootstrapped switch 100 is that the signal at the input terminal VI cannot be bootstrapped to the control terminal of the NMOS transistor 106 until both the switch 103 and the switch 104 are turned on, which limits the operating speed of the bootstrapped switch 100.

SUMMARY OF THE INVENTION

In view of the issues of the prior art, an object of the present invention is to provide a switch circuit, so as to make an improvement to the prior art.

According to one aspect of the present invention, a switch circuit is provided. The switch circuit has an input terminal and an output terminal and includes a first capacitor, a second capacitor, a first switch, a second switch, a third switch, a fourth switch, a fifth switch, and a switch group. The first capacitor has two terminals, which are respectively a first node and a second node. The second capacitor has two terminals, which are respectively a third node and a fourth node. The first switch has a first terminal, a second terminal, and a first control terminal. The first terminal is coupled to the input terminal, and the second terminal is coupled to the output terminal. The second switch has a third terminal, a fourth terminal, and a second control terminal. The third terminal is coupled to the second node, and the fourth terminal is coupled to the first control terminal. The third switch has a fifth terminal, a sixth terminal, and a third control terminal. The fifth terminal is coupled to a first reference voltage, the sixth terminal is coupled to the second control terminal, and the third control terminal receives a clock. The fourth switch has a seventh terminal, an eighth terminal, and a fourth control terminal. The seventh terminal is coupled to the first node or a second reference voltage, the eighth terminal is coupled to the second control terminal, and the fourth control terminal receives the clock. The fifth switch has a ninth terminal, a tenth terminal, and a fifth control terminal. The ninth terminal is coupled to the first control terminal, the tenth terminal is coupled to the second reference voltage, and the fifth control terminal receives an inverted signal of the clock. The switch group is coupled to the first node, the second node, the third node, and the fourth node. When the clock is at a first level, the switch group couples the third node to the second node and the fourth node to the first node. When the clock is at a second level, the switch group couples the third node to a first voltage and the fourth node to a second voltage. The first level is not equal to the second level.

According to another aspect of the present invention, a switch circuit is provided. The switch circuit has an input terminal and an output terminal and includes a first capacitor, a second capacitor, a first switch, a second switch, a third switch, a fourth switch, a fifth switch, and a switch group. The first capacitor has two terminals, which are respectively a first node and a second node. The second capacitor has two terminals, which are respectively a third node and a fourth node. The first switch has a first terminal, a second terminal, and a first control terminal. The first terminal is coupled to the input terminal, and the second terminal is coupled to the output terminal. The second switch has a third terminal, a fourth terminal, and a second control terminal. The third terminal is coupled to the second node, and the fourth terminal is coupled to the first control terminal. The third switch has a fifth terminal, a sixth terminal, and a third control terminal. The fifth terminal is coupled to a first reference voltage, the sixth terminal is coupled to the second control terminal, and the third control terminal receives a clock. The fourth switch has a seventh terminal, an eighth terminal, and a fourth control terminal. The seventh terminal is coupled to the first node or a second reference voltage, the eighth terminal is coupled to the second control terminal, and the fourth control terminal receives the clock. The fifth switch has a ninth terminal, a tenth terminal, and a fifth control terminal. The ninth terminal is coupled to the first control terminal, the tenth terminal is coupled to the second reference voltage, and the fifth control terminal receives an inverted signal of the clock. The switch group is coupled to the first node, the second node, the third node, and the fourth node. When the clock is at a first level, the switch group connects the second capacitor in parallel with the first capacitor. When the clock is at a second level, the switch group does not couple the second capacitor to the first capacitor. The first level is not equal to the second level.

The technical means embodied in the embodiments of the present invention can solve at least one of the problems of the prior art. Therefore, compared to the prior art, the present invention can improve the operating speed of the switch component.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said “indirect” means that an intermediate object or a physical space exists between the objects, or an intermediate event or a time interval exists between the events.

The disclosure herein includes a switch circuit. On account of that some or all elements of the switch circuit could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In the following discussion, each transistor has a first terminal, a second terminal, and a control terminal. When the transistor is used as a switch, the first terminal and the second terminal of the transistor are the two terminals of the switch, and the control terminal controls the switch to be turned on (the transistor is turned on) or turned off (the transistor is turned off). For a Metal-Oxide-Semiconductor Field-Effect Transistor (MOSFET), the first terminal may be one of the source and the drain, the second terminal may be the other of the source and the drain, and the control terminal is the gate. For a bipolar junction transistor (BJT), the first terminal may be one of the collector and the emitter, the second terminal may be the other of the collector and the emitter, and the control terminal is the base.

Figure 1:
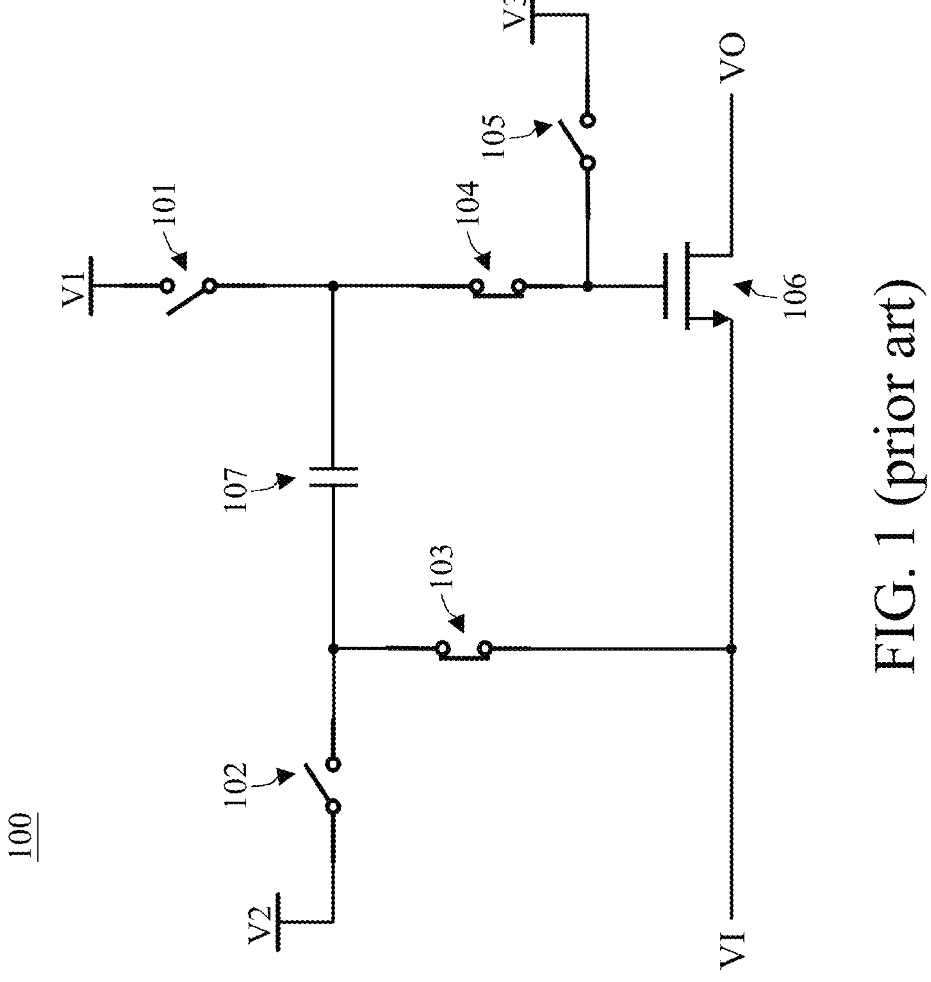
FIG. 1 is a circuit diagram of a conventional bootstrapped switch.
Figure 2:
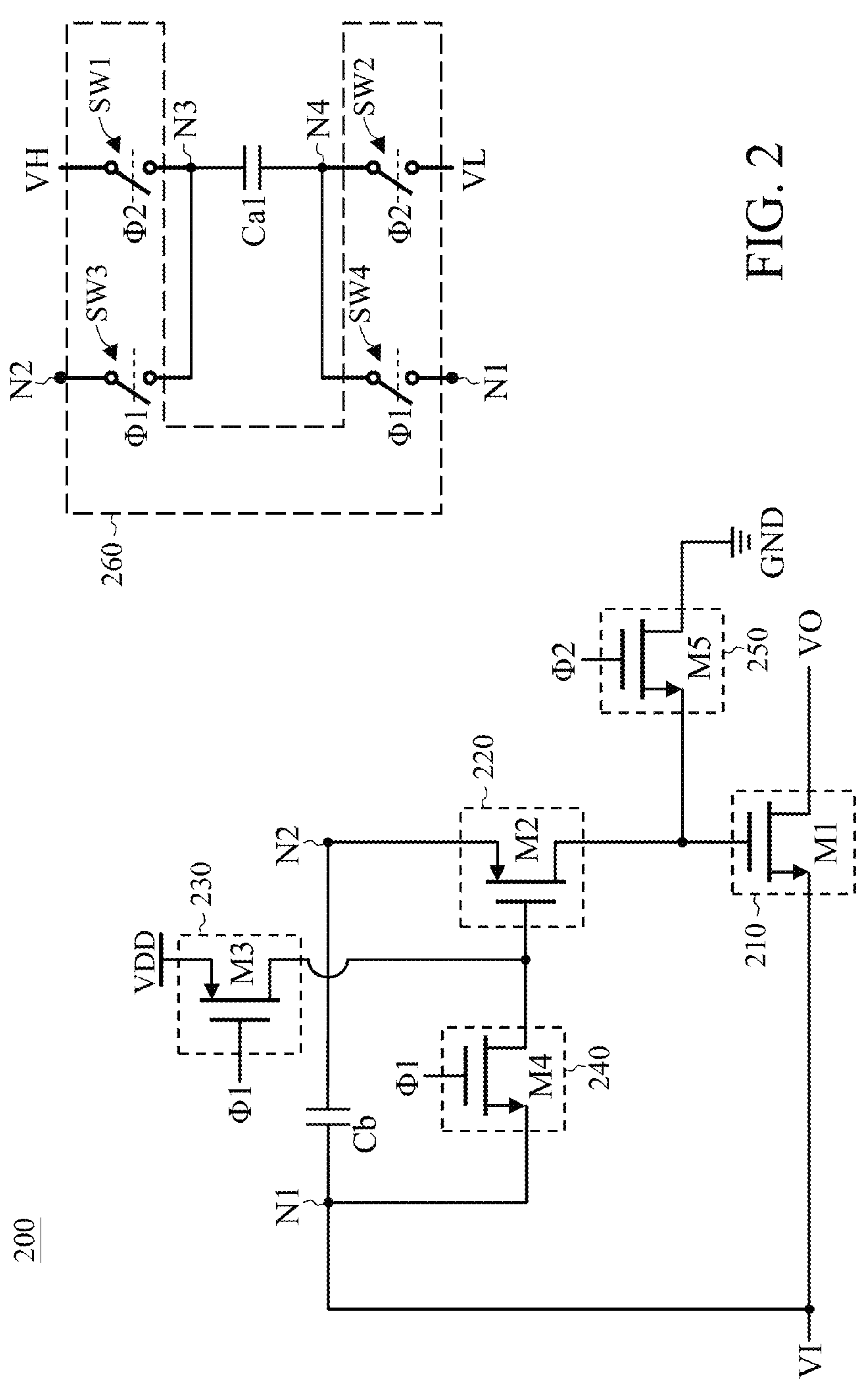
FIG. 2 is the circuit diagram of a switch circuit according to an embodiment of the present invention.

Reference is made to FIG. 2, which is the circuit diagram of a switch circuit according to an embodiment of the present invention. A switch circuit 200 includes a switch 210, a switch 220, a switch 230, a switch 240, a switch 250, a switch group 260, a capacitor Ca1, and a bootstrap capacitor Cb. The switch group 260 includes a switch SW1, a switch SW2, a switch SW3, and a switch SW4. The switch circuit 200 is turned on or off according to the clock Φ1 and the clock Φ2. When the switch circuit 200 is turned on, the voltage at the output terminal VO is substantially equal to the voltage at the input terminal VI. The two terminals of the bootstrap capacitor Cb are the node N1 and the node N2, respectively. The two terminals of the capacitor Ca1 are the node N3 and the node N4.

The switch 210 is embodied by an NMOS transistor M1. One terminal (source) of the switch 210 is coupled or electrically connected to the input terminal VI; another terminal (drain) of the switch 210 is coupled or electrically connected to the output terminal VO; the control terminal of the switch 210 is the gate of the NMOS transistor M1.

The switch 220 is embodied by a P-channel Metal-Oxide-Semiconductor Field-Effect Transistor (hereinafter referred to as PMOS transistor) M2. One terminal (source) of the switch 220 is coupled or electrically connected to the node N2; another terminal (drain) of the switch 220 is coupled or electrically connected to the control terminal of the switch 210; the control terminal of the switch 220 is the gate of the PMOS transistor M2.

The switch 230 is embodied by a PMOS transistor M3. One terminal (source) of the switch 230 is coupled or electrically connected to the reference voltage VDD (e.g., a power supply voltage); another terminal (drain) of the switch 230 is coupled or electrically connected to the control terminal of the switch 220; the control terminal of the switch 230 receives the clock Φ1.

The switch 240 is embodied by an NMOS transistor M4. One terminal (source) of the switch 240 is coupled or electrically connected to the node N1; another terminal (drain) of the switch 240 is coupled or electrically connected to the control terminal of the switch 220; the control terminal of the switch 240 receives the clock Φ1.

The switch 250 is embodied by an NMOS transistor M5. One terminal (source) of the switch 250 is coupled or electrically connected to the control terminal of the switch 210; another terminal (drain) of the switch 250 is coupled or electrically connected to the reference voltage GND (e.g., ground level); the control terminal of the switch 250 receives the clock Φ2.

One terminal of the switch SW1 is coupled or electrically connected to the node N3; another terminal of the switch SW1 is coupled or electrically connected to the voltage VH.

One terminal of the switch SW2 is coupled or electrically connected to the node N4; another terminal of the switch SW2 is coupled or electrically connected to the voltage VL.

One terminal of the switch SW3 is coupled or electrically connected to the node N2; another terminal of the switch SW3 is coupled or electrically connected to the node N3.

One terminal of the switch SW4 is coupled or electrically connected to the node N1; another terminal of the switch SW4 is coupled or electrically connected to the node N4.

The voltage VH is not equal to the voltage VL. The voltage VH may or may not be equal to the reference voltage VDD. The voltage VL may or may not be equal to the reference voltage GND. In some embodiments, the voltage VH is equal to the reference voltage VDD, and the voltage VL is equal to the reference voltage GND, to simplify the circuit design.

Figure 3A:
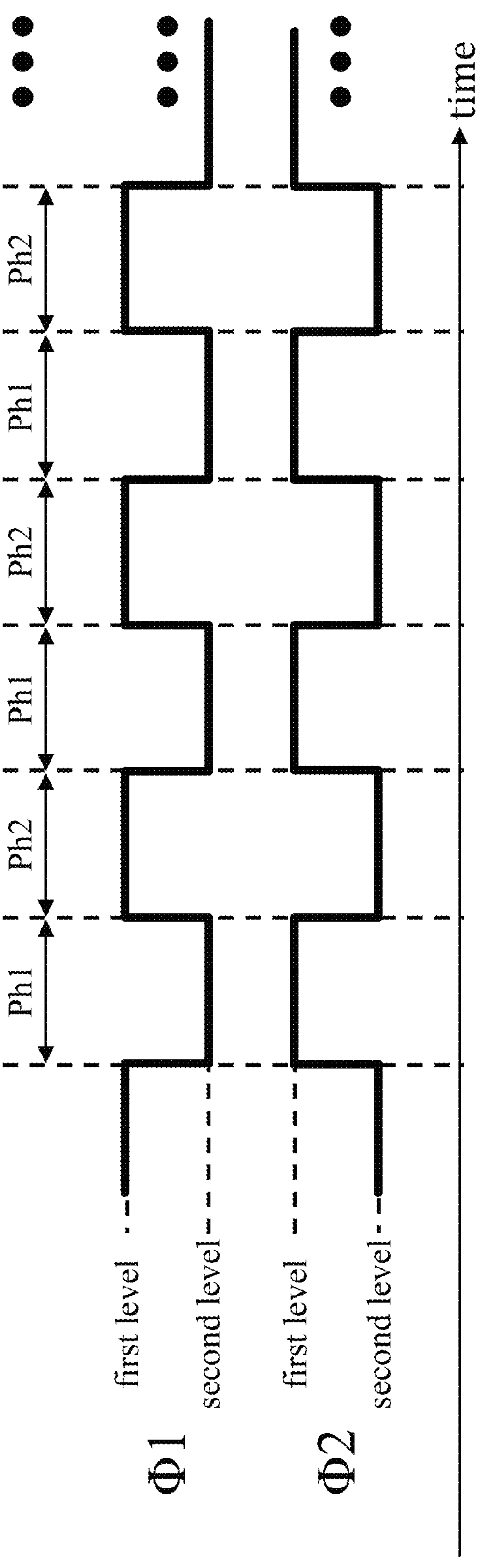
FIG. 3A shows the waveform of clocks according to an embodiment of the present invention.

Reference is made to FIG. 3A, which shows the waveform of clocks according to an embodiment of the present invention. In the embodiment of FIG. 3A, the clock Φ1 and the clock Φ2 are inverted signals of each other. More specifically, when the clock Φ1 is at the first level (e.g., a high level), the clock Φ2 is at the second level (e.g., a low level). When the clock Φ1 is at the second level, the clock Φ2 is at the first level. That is to say, although the clock Φ1 and the clock Φ2 are both depicted in FIG. 2, the switch circuit 200 may operate based on either the clock Φ1 or the clock Φ2 alone.

During a phase Ph1 (where the clock Φ1 is at the second level and the clock Φ2 is at the first level), the switch circuit 200 is turned off, and the capacitor Ca1 is charging. More specifically, during the phase Ph1, the switch 230 is turned on, the switch 240 is turned off, and the switch 250 is turned on, which causes the switch 210 and the switch 220 to turn off; therefore, the switch circuit 200 is turned off.

During the phase Ph1, the switch SW1 and the switch SW2 are turned on, while the switch SW3 and the switch SW4 are turned off. In other words, during the phase Ph1, the switch group 260 couples or electrically connects the two terminals of the capacitor Ca1 to the voltage VH and the voltage VL, respectively, in order to charge the capacitor Ca1. At this time, the capacitor Ca1 is not coupled to the bootstrap capacitor Cb.

During a phase Ph2 (where the clock Φ1 is at the first level and the clock Φ2 is at the second level), the switch circuit 200 is turned on, and the capacitor Ca1 is connected in parallel with the bootstrap capacitor Cb. More specifically, during the phase Ph2, the switch 230 is turned off, the switch 240 is turned on, and the switch 250 is turned off, which causes the switch 210 and the switch 220 to turn on; therefore, the switch circuit 200 is turned on.

During the phase Ph2, the switch SW1 and the switch SW2 are turned off, while the switch SW3 and the switch SW4 are turned on. In other words, during the phase Ph2, the switch group 260 couples or electrically connects the node N4 and the node N3 to the node N1 and the node N2, respectively, so that the capacitor Ca1 is connected in parallel with the bootstrap capacitor Cb.

Because the capacitor Ca1 charges during the phase Ph1, it can boost the voltage across the bootstrap capacitor Cb during the phase Ph2 (which is equivalent to charging the bootstrap capacitor Cb), thereby increasing the turn-on speed of the switch circuit 200 (i.e., reducing the time required to switch from off to on).

Figure 3B:
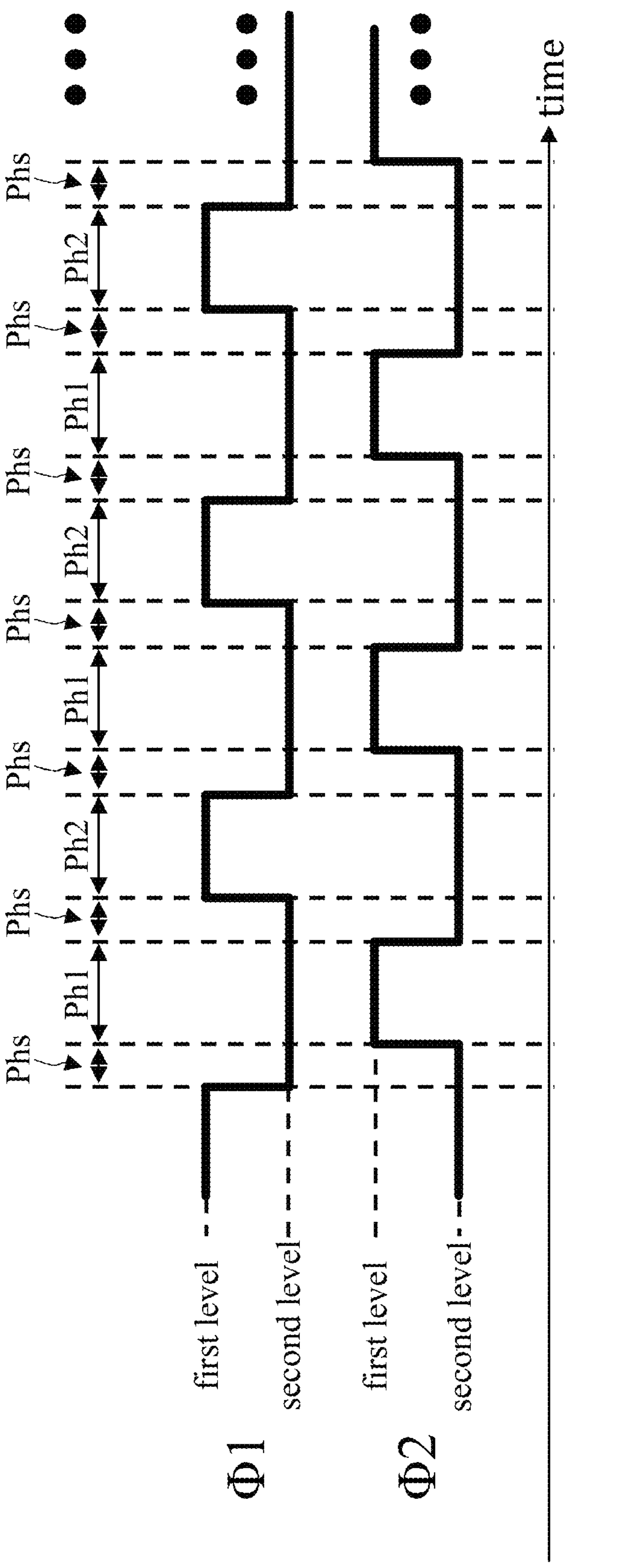
FIG. 3B shows the waveform of clocks according to another embodiment of the present invention.

Reference is made to FIG. 3B, which shows the waveform of clocks according to another embodiment of the present invention. As shown in FIG. 3B, the clock Φ1 and the clock Φ2 may also be non-overlapping clocks. More specifically, the clock Φ1 and the clock Φ2 are not at the first level at the same time (e.g., the phase Ph1 or the phase Ph2) but may simultaneously be at the second level (e.g., the phase Phs).

In summary, the input terminal VI of the switch circuit 200 is electrically connected to the node N1, which is one terminal of the bootstrap capacitor Cb (i.e., the input terminal VI and the node N1 are the same node, meaning that there are no components between the input terminal VI and the node N1), significantly reducing the time for the signal at the input terminal VI to be bootstrapped to the control terminal of the switch 210, thereby enhancing the operating speed of the switch circuit 200.

Figure 4:
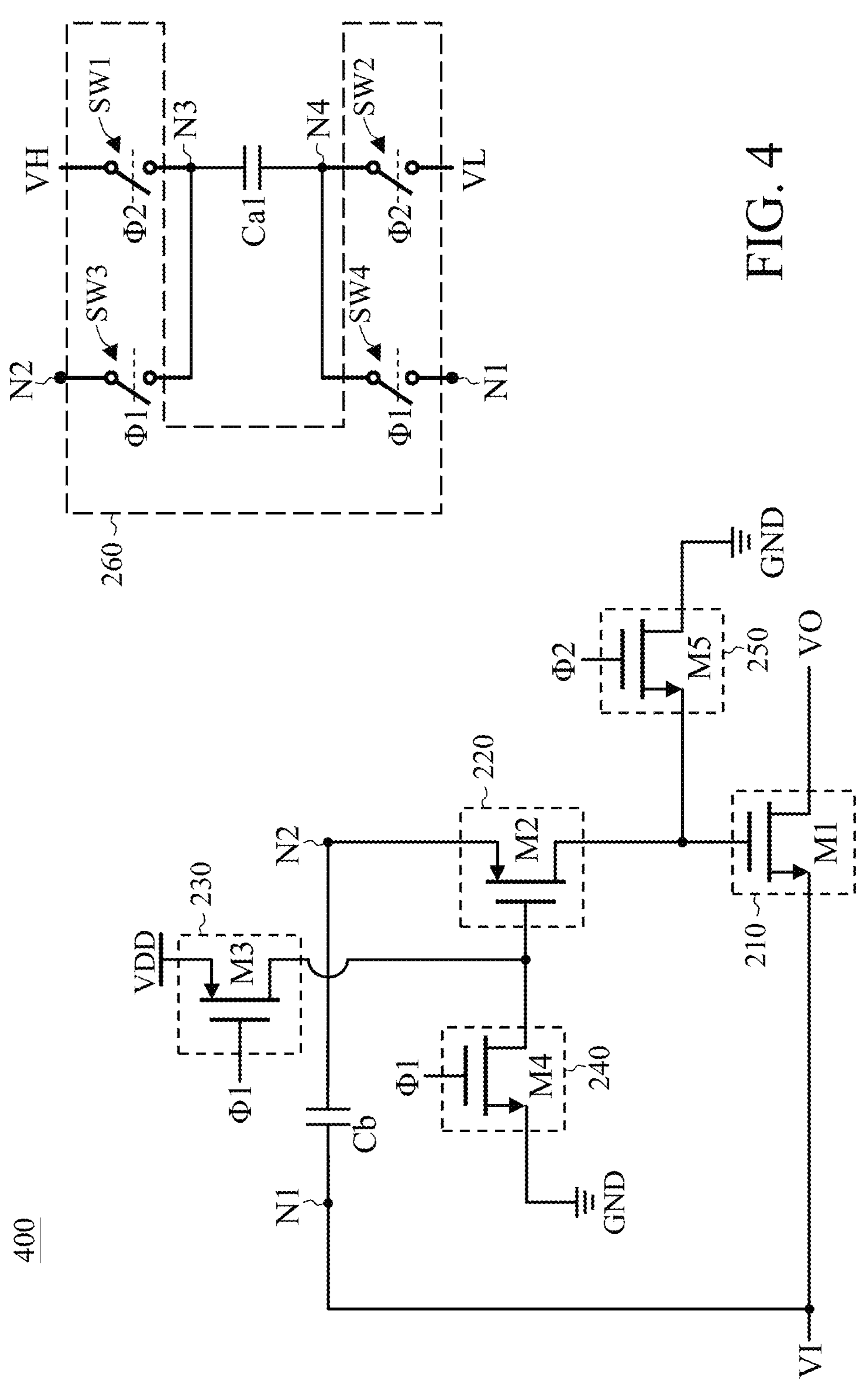
FIG. 4 is the circuit diagram of a switch circuit according to another embodiment of the present invention.

Reference is made to FIG. 4, which is the circuit diagram of a switch circuit according to another embodiment of the present invention. A switch circuit 400 is similar to the switch circuit 200, except that in the embodiment of FIG. 4, the source of the NMOS transistor M4 is coupled or electrically connected to the reference voltage GND, rather than to the node N1.

Figure 5:
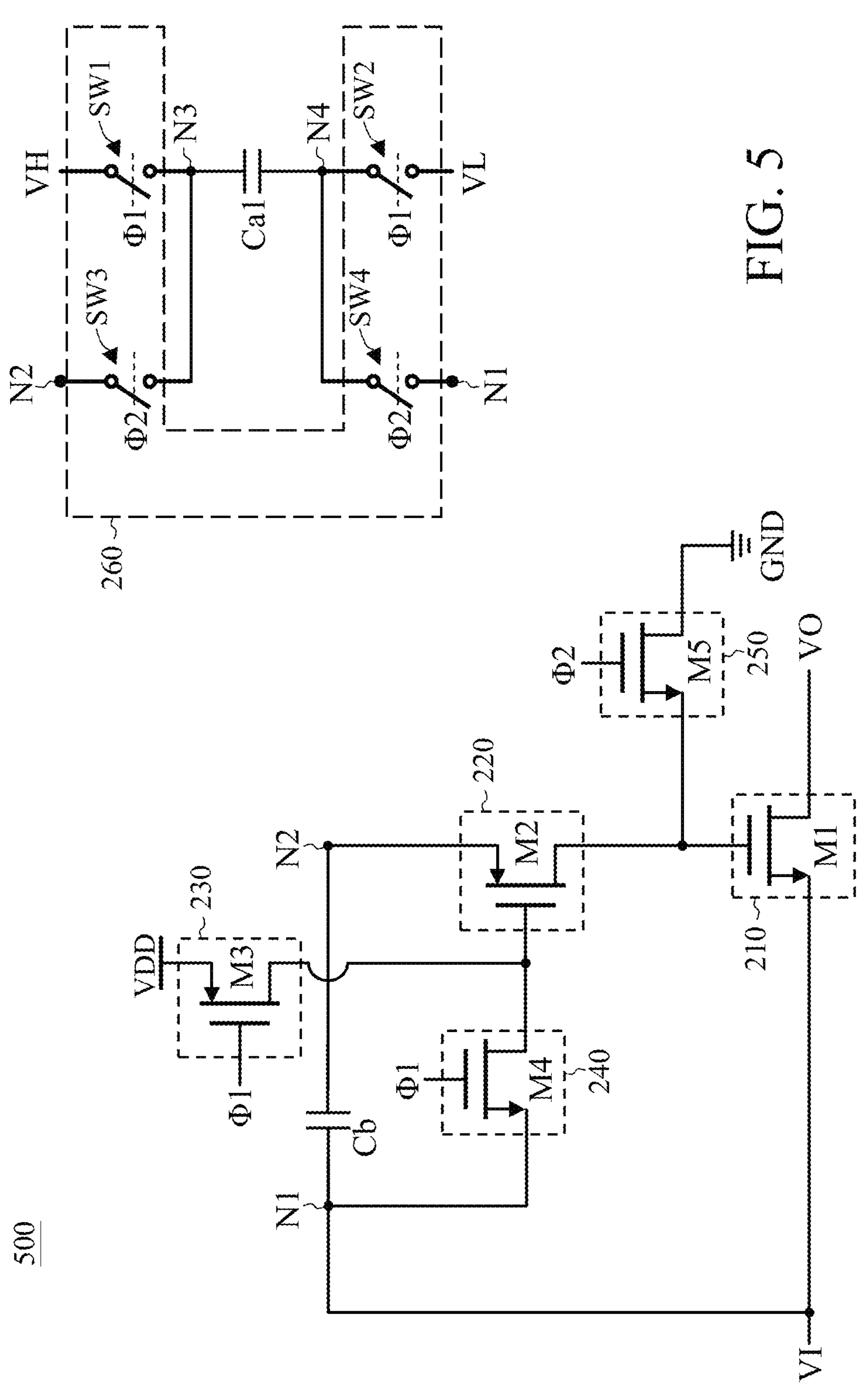
FIG. 5 is the circuit diagram of a switch circuit according to another embodiment of the present invention.

Reference is made to FIG. 5, which is the circuit diagram of a switch circuit according to another embodiment of the present invention. The switch circuit 500 is similar to the switch circuit 200, except that in the embodiment of FIG. 5, the switch group 260 couples or electrically connects the two terminals of the capacitor Ca1 to the voltage VH and the voltage VL respectively during the phase Ph2 (to charge the capacitor Ca1), while during the phase Ph1, the switch group 260 couples or electrically connects the two terminals of the capacitor Ca1 to the node N1 and the node N2 respectively (to charge the bootstrap capacitor Cb). That is to say, in the embodiment of FIG. 2, the capacitor Ca1 charges the bootstrap capacitor Cb when the switch circuit 200 is turned on, while in the embodiment of FIG. 5, the capacitor Ca1 charges the bootstrap capacitor Cb when the switch circuit 500 is turned off. Both implementations can achieve the goal of maintaining or boosting the voltage across the bootstrap capacitor Cb.

Figure 6:
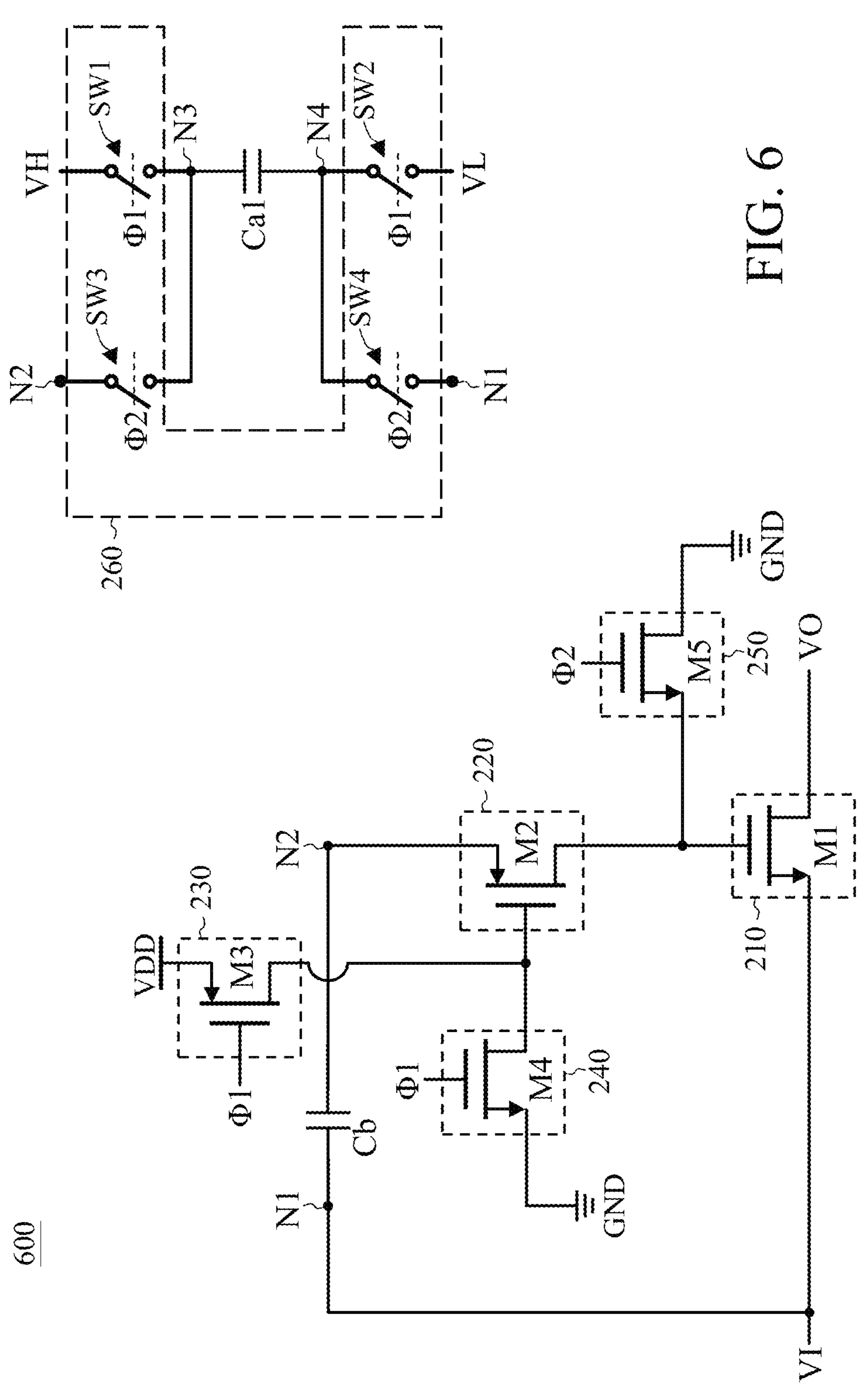
FIG. 6 is the circuit diagram of a switch circuit according to another embodiment of the present invention.

Reference is made to FIG. 6, which is the circuit diagram of a switch circuit according to another embodiment of the present invention. The switch circuit 600 is similar to the switch circuit 500, except that in the embodiment of FIG. 6, the source of the NMOS transistor M4 is coupled or electrically connected to the reference voltage GND, rather than to the node N1.

Figure 7:
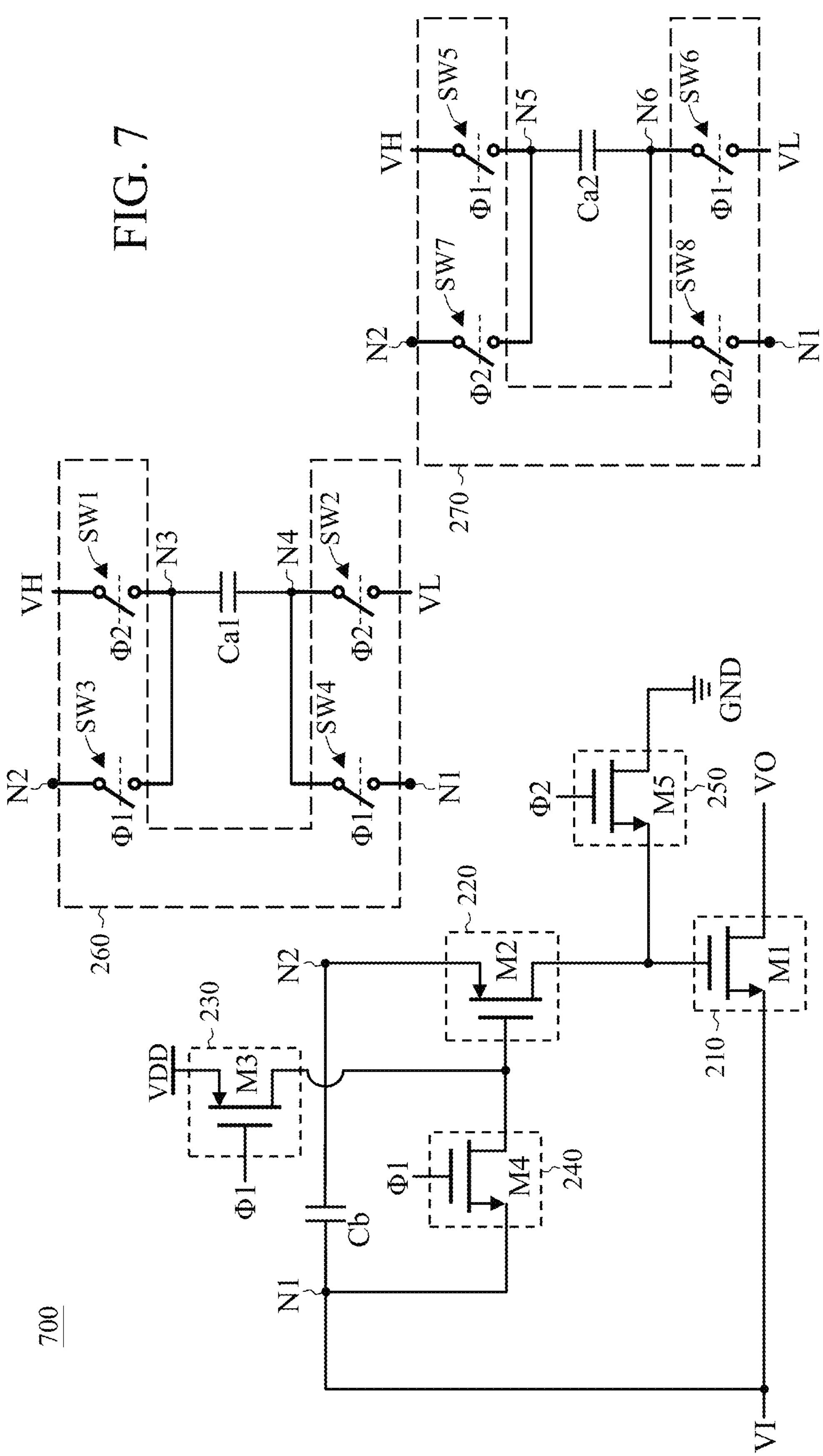
FIG. 7 is the circuit diagram of a switch circuit according to another embodiment of the present invention.

Reference is made to FIG. 7, which is the circuit diagram of a switch circuit according to another embodiment of the present invention. The switch circuit 700 is similar to the switch circuit 200, except that the switch circuit 700 further includes a switch group 270 and a capacitor Ca2. The capacitor Ca2 has two terminals, which are the node N5 and the node N6, respectively. The switch group 270 includes a switch SW5, a switch SW6, a switch SW7, and a switch SW8.

One terminal of the switch SW5 is coupled or electrically connected to the node N5; another terminal of the switch SW5 is coupled or electrically connected to the voltage VH.

One terminal of the switch SW6 is coupled or electrically connected to the node N6; another terminal of the switch SW6 is coupled or electrically connected to the voltage VL.

One terminal of the switch SW7 is coupled or electrically connected to the node N2; another terminal of the switch SW7 is coupled or electrically connected to the node N5.

One terminal of the switch SW8 is coupled or electrically connected to the node N1; another terminal of the switch SW8 is coupled or electrically connected to the node N6.

The switch circuit 700 operates according to the clock Φ1 and the clock @2. More specifically, during the phase Ph1 (when the switches SW1, SW2, SW7, and SW8 are turned on, and the switches SW3, SW4, SW5, and SW6 are turned off), the capacitor Ca1 is charging, and the capacitor Ca2 is connected in parallel with the bootstrap capacitor Cb (where the switch group 270 couples or electrically connects the node N6 to the node N1 and the node N5 to the node N2). During the phase Ph2 (when the switches SW1, SW2, SW7, and SW8 are turned off, and the switches SW3, SW4, SW5, and SW6 are turned on), the capacitor Ca1 is connected in parallel with the bootstrap capacitor Cb, and the capacitor Ca2 is charging (where the switch group 270 couples or electrically connects the two terminals of the capacitor Ca2 to the voltage VH and the voltage VL, respectively). That is to say, the voltage across the bootstrap capacitor Cb may be substantially continuously boosted (i.e., the capacitors Ca1 and Ca2 alternately charge the bootstrap capacitor Cb).

Figure 8:
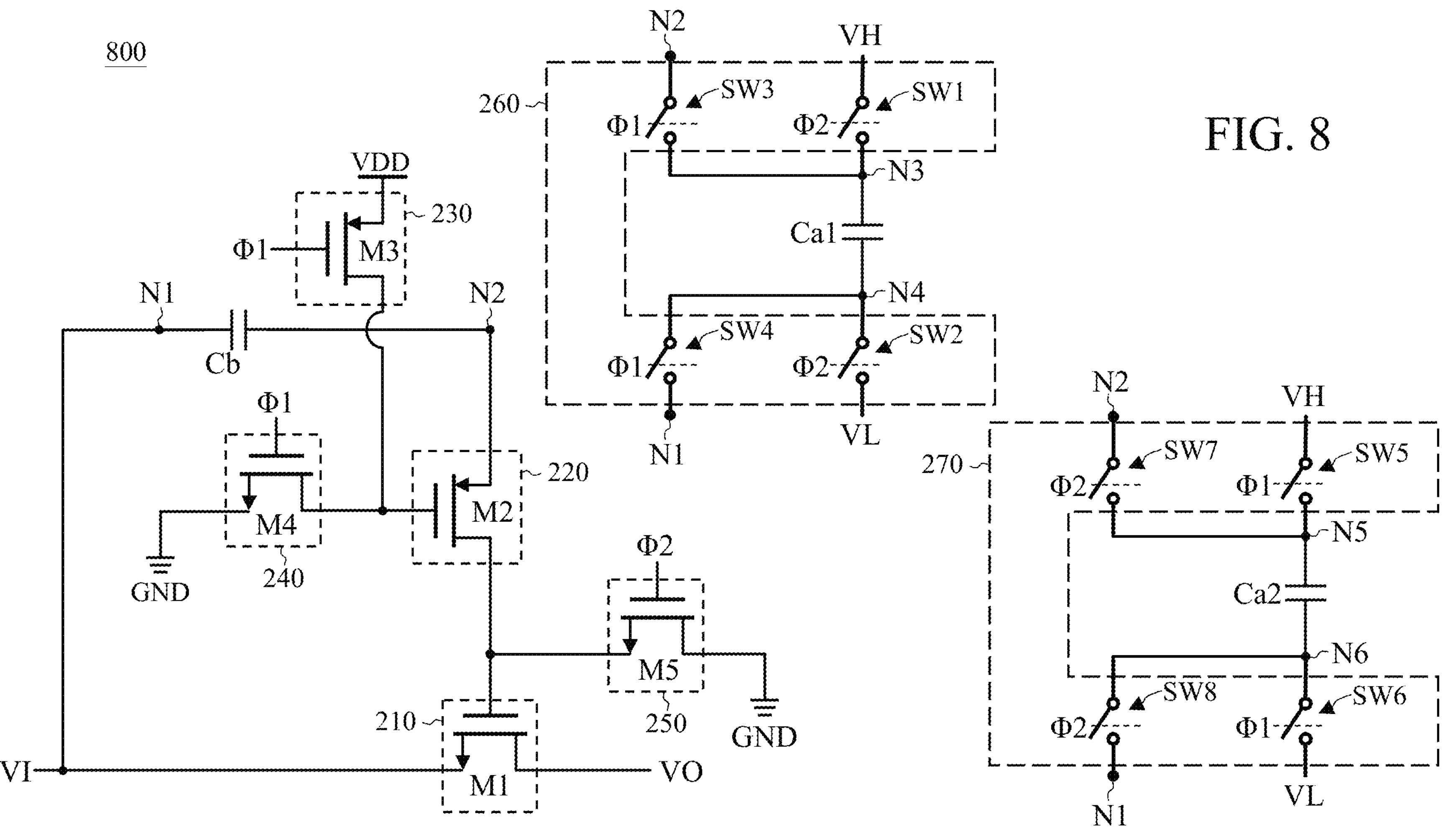
FIG. 8 is the circuit diagram of a switch circuit according to another embodiment of the present invention.

Reference is made to FIG. 8, which is the circuit diagram of a switch circuit according to another embodiment of the present invention. The switch circuit 800 is similar to the switch circuit 700, except that in the embodiment of FIG. 8, the source of the NMOS transistor M4 is coupled or electrically connected to the reference voltage GND, rather than to the node N1.

In summary, in the switch circuits of the present invention, because there is only a capacitor (Cb) and a switch (220) connected between the input terminal VI and the control terminal of the switch 210, the operating speed of the switch circuit is faster. By contrast, in the conventional bootstrapped switch 100, the presence of a capacitor (107) and two switches (103, 104) between the input terminal VI and the control terminal of the NMOS transistor 106 results in a relatively slow operating speed for the bootstrapped switch 100.

In an alternative embodiment, the PMOS transistors and the NMOS transistors in the aforementioned embodiments may be respectively replaced by NMOS transistors and PMOS transistors. People having ordinary skill in the art know how to correspondingly adjust the clock and the reference voltages to implement the aforementioned embodiments.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A switch circuit having an input terminal and an output terminal, the switch circuit comprising:

- a first capacitor having two terminals respectively being a first node and a second node;
- a second capacitor having two terminals respectively being a third node and a fourth node;
- a first switch having a first terminal, a second terminal, and a first control terminal, wherein the first terminal is coupled to the input terminal, and the second terminal is coupled to the output terminal;
- a second switch having a third terminal, a fourth terminal, and a second control terminal, wherein the third terminal is coupled to the second node, and the fourth terminal is coupled to the first control terminal;
- a third switch having a fifth terminal, a sixth terminal, and a third control terminal, wherein the fifth terminal is coupled to a first reference voltage, the sixth terminal is coupled to the second control terminal, and the third control terminal receives a clock;
- a fourth switch having a seventh terminal, an eighth terminal, and a fourth control terminal, wherein the seventh terminal is coupled to the first node or a second reference voltage, the eighth terminal is coupled to the second control terminal, and the fourth control terminal receives the clock;
- a fifth switch having a ninth terminal, a tenth terminal, and a fifth control terminal, wherein the ninth terminal is coupled to the first control terminal, the tenth terminal is coupled to the second reference voltage, and the fifth control terminal receives an inverted signal of the clock; and
- a switch group coupled to the first node, the second node, the third node, and the fourth node;
- wherein when the clock is at a first level, the switch group couples the third node to the second node and couples the fourth node to the first node; when the clock is at a second level, the switch group couples the third node to a first voltage and couples the fourth node to a second voltage; the first level is not equal to the second level.

2. The switch circuit of claim 1, wherein the first node and the input terminal are a same node.

3. The switch circuit of claim 2, wherein when the clock is at the first level, the switch circuit is turned on, and when the clock is at the second level, the switch circuit is turned off.

4. The switch circuit of claim 3, wherein the switch group comprises:

- a sixth switch coupled between the third node and the first voltage;
- a seventh switch coupled between the fourth node and the second voltage;
- an eighth switch coupled between the third node and the second node; and
- a ninth switch coupled between the fourth node and the first node;
- wherein when the clock is at the first level, the sixth switch and the seventh switch are turned off, and the eighth switch and the ninth switch are turned on; when the clock is at the second level, the sixth switch and the seventh switch are turned on, and the eighth switch and the ninth switch are turned off.

5. The switch circuit of claim 2, wherein when the clock is at the first level, the switch circuit is turned off, and when the clock is at the second level, the switch circuit is turned on.

6. The switch circuit of claim 5, wherein the switch group comprises:

- a sixth switch coupled between the third node and the first voltage;
- a seventh switch coupled between the fourth node and the second voltage;
- an eighth switch coupled between the third node and the second node; and
- a ninth switch coupled between the fourth node and the first node;
- wherein when the clock is at the first level, the sixth switch and the seventh switch are turned off, and the eighth switch and the ninth switch are turned on; when the clock is at the second level, the sixth switch and the seventh switch are turned on, and the eighth switch and the ninth switch are turned off.

7. The switch circuit of claim 2, wherein the switch group is a first switch group, the switch circuit further comprising:

- a third capacitor having two terminals respectively being a fifth node and a sixth node; and
- a second switch group coupled to the first node, the second node, the fifth node, and the sixth node;
- wherein when the clock is at the first level, the second switch group couples the fifth node to the first voltage and couples the sixth node to the second voltage; when the clock is at the second level, the second switch group couples the fifth node to the second node and couples the sixth node to the first node; the first level is not equal to the second level.

8. The switch circuit of claim 7, wherein when the clock is at the first level, the switch circuit is turned on, and when the clock is at the second level, the switch circuit is turned off.

9. The switch circuit of claim 8, wherein the first switch group and the second switch group comprise:

- a sixth switch coupled between the third node and the first voltage;
- a seventh switch coupled between the fourth node and the second voltage;
- an eighth switch coupled between the third node and the second node;
- a ninth switch coupled between the fourth node and the first node;
- a tenth switch coupled between the fifth node and the first voltage;
- an eleventh switch coupled between the sixth node and the second voltage;

a twelfth switch coupled between the fifth node and the second node; and a thirteenth switch coupled between the sixth node and the first node;

when the clock is at the first level, the sixth switch, the seventh switch, the twelfth switch, and the thirteenth switch are turned off, and the eighth switch, the ninth switch, the tenth switch, and the eleventh switch are turned on; when the clock is at the second level, the sixth switch, the seventh switch, the twelfth switch, and the thirteenth switch are turned on, and the eighth switch, the ninth switch, the tenth switch, and the eleventh switch are turned off.

10. A switch circuit having an input terminal and an output terminal, comprising:

a first capacitor having two terminals respectively being a first node and a second node;

a second capacitor having two terminals respectively being a third node and a fourth node;

a first switch having a first terminal, a second terminal, and a first control terminal, wherein the first terminal is coupled to the input terminal, and the second terminal is coupled to the output terminal;

a second switch having a third terminal, a fourth terminal, and a second control terminal, wherein the third terminal is coupled to the second node, and the fourth terminal is coupled to the first control terminal;

a third switch having a fifth terminal, a sixth terminal, and a third control terminal, wherein the fifth terminal is coupled to a first reference voltage, the sixth terminal is coupled to the second control terminal, and the third control terminal receives a clock;

a fourth switch having a seventh terminal, an eighth terminal, and a fourth control terminal, wherein the seventh terminal is coupled to the first node or a second reference voltage, the eighth terminal is coupled to the second control terminal, and the fourth control terminal receives the clock;

a fifth switch having a ninth terminal, a tenth terminal, and a fifth control terminal, wherein the ninth terminal is coupled to the first control terminal, the tenth terminal is coupled to the second reference voltage, and the fifth control terminal receives an inverted signal of the clock; and a switch group coupled to the first node, the second node, the third node, and the fourth node;

wherein when the clock is at a first level, the switch group connects the second capacitor in parallel with the first capacitor; when the clock is at a second level, the switch group does not couple the second capacitor to the first capacitor; the first level is not equal to the second level.

11. The switch circuit of claim 10, wherein the first node and the input terminal are a same node.

12. The switch circuit of claim 11, wherein when the clock is at the first level, the switch circuit is turned on, and when the clock is at the second level, the switch circuit is turned off.

13. The switch circuit of claim 12, wherein the switch group comprises:

a sixth switch coupled between the third node and a first voltage;

a seventh switch coupled between the fourth node and a second voltage;

an eighth switch coupled between the third node and the second node; and a ninth switch coupled between the fourth node and the first node;

wherein when the clock is at the first level, the sixth switch and the seventh switch are turned off, and the eighth switch and the ninth switch are turned on; when the clock is at the second level, the sixth switch and the seventh switch are turned on, and the eighth switch and the ninth switch are turned off.

14. The switch circuit of claim 11, wherein when the clock is at the first level, the switch circuit is turned off, and when the clock is at the second level, the switch circuit is turned on.

15. The switch circuit of claim 14, wherein the switch group comprises:

a sixth switch coupled between the third node and a first voltage;

a seventh switch coupled between the fourth node and a second voltage;

an eighth switch coupled between the third node and the second node; and a ninth switch coupled between the fourth node and the first node;

wherein when the clock is at the first level, the sixth switch and the seventh switch are turned off, and the eighth switch and the ninth switch are turned on; when the clock is at the second level, the sixth switch and the seventh switch are turned on, and the eighth switch and the ninth switch are turned off.

16. The switch circuit of claim 11, wherein the switch group is a first switch group, the switch circuit further comprising:

a third capacitor having two terminals respectively being a fifth node and a sixth node; and a second switch group coupled to the first node, the second node, the fifth node, and the sixth node;

wherein when the clock is at the first level, the second switch group couples the fifth node to a first voltage and couples the sixth node to a second voltage; when the clock is at the second level, the second switch group couples the fifth node to the second node and couples the sixth node to the first node; the first level is not equal to the second level.

17. The switch circuit of claim 16, wherein when the clock is at the first level, the switch circuit is turned on, and when the clock is at the second level, the switch circuit is turned off.

18. The switch circuit of claim 17, wherein the first switch group and the second switch group comprise:

a sixth switch coupled between the third node and the first voltage;

a seventh switch coupled between the fourth node and the second voltage;

an eighth switch coupled between the third node and the second node;

a ninth switch coupled between the fourth node and the first node;

a tenth switch coupled between the fifth node and the first voltage;

an eleventh switch coupled between the sixth node and the second voltage;

a twelfth switch coupled between the fifth node and the second node; and a thirteenth switch coupled between the sixth node and the first node;

when the clock is at the first level, the sixth switch, the seventh switch, the twelfth switch, and the thirteenth switch are turned off, and the eighth switch, the ninth switch, the tenth switch, and the eleventh switch are turned on; when the clock is at the second level, the sixth switch, the seventh switch, the twelfth switch, and the thirteenth switch are turned on, and the eighth switch, the ninth switch, the tenth switch, and the eleventh switch are turned off.

* * * * *